(12) United States Patent
Hebert

(10) Patent No.: US 6,316,970 B1
(45) Date of Patent: Nov. 13, 2001

(54) FLOATING, BALANCED OUTPUT CIRCUIT

(75) Inventor: Gary K. Hebert, Shrewsbury, MA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 09/708,869

(22) Filed: Nov. 8, 2000

Related U.S. Application Data

(60) Provisional application No. 60/164,359, filed on Nov. 9, 1999.

(51) Int. Cl.[7] .................................................. H03K 5/22
(52) U.S. Cl. ............................................ 327/67; 327/560
(58) Field of Search .............................. 327/65, 67, 77, 327/560–563; 330/258, 260

(56) References Cited

U.S. PATENT DOCUMENTS

| | | | |
|---|---|---|---|
| 4,979,218 | 12/1990 | Strahm | 381/94 |
| 5,311,088 | * 5/1994 | Nelson | 327/65 |
| 5,491,447 | 2/1996 | Goetschel et al. | 330/254 |
| 5,574,678 | 11/1996 | Gorecki | 364/807 |
| 5,861,778 | * 1/1999 | Louagie et al. | 330/258 |

* cited by examiner

Primary Examiner—Toan Tran
(74) Attorney, Agent, or Firm—McDermott, Will & Emery

(57) ABSTRACT

A floating, balanced output stage maintains control of the common-mode output current in both output legs even when the differential voltage output is clipped. The circuit includes a pair of transconductance amplifier sections one for providing a differential pair of output currents in response to the input voltage, the currents being substantially equal in magnitude and opposite in polarity; an intermediate section connected so as to generate an intermediate differential output voltage, across two outputs of the intermediate section, in response to the pair of output currents of the first transconductance amplifier; an output section for generating the differential output voltage in response to the pair of voltages generated by the intermediate section; a differential feedback loop configuration connected around the first transconductance amplifier and the intermediate section so as to provide differential negative feedback in response to the intermediate differential output voltage generated by the intermediate section; and a common-mode feedback loop configuration comprising a second transconductance amplifier section connected around the intermediate section so as to respectively add a pair of substantially matched output currents to the output currents of the first transconductance amplifier stage in response to the common mode current.

21 Claims, 7 Drawing Sheets

FLOATING, BALANCED OUTPUT CIRCUIT

This application claims benefit of provisional application 60/164,359, filed Nov. 9, 1999.

FIELD OF THE DISCLOSURE

The present application relates to a floating, balanced output circuits, and more specifically to an improved floating, balanced output circuit that maintains control of the common-mode output current in both output legs of the circuit even when the differential voltage output is clipped and the circuit is driving a ground-referred load.

BACKGROUND OF THE DISCLOSURE

Professional audio equipment often employs electronically-balanced output circuits intended to mimic the behavior of output transformers as closely as possible. Such circuits are designed to accept a single-ended input voltage and to produce a differential output voltage with a low differential output impedance. They are further designed to possess a substantially higher common-mode output impedance (common-mode output impedance being defined as the impedance from either leg of the differential output to the ground or reference potential). This allows the differential output voltage to "float" with the common-mode voltage of the load, thus allowing the circuit to properly drive both balanced and ground-referred loads. This behavior is similar to that of an output transformer, wherein the differential output impedance is determined by the source impedance driving the primary reflected to the secondary (output) winding, while the impedance from either leg of the secondary winding to ground is quite high, being determined primarily by the stray capacitance from the secondary winding to ground. A consequence of this arrangement is that the output currents exiting the two legs of the balanced output are substantially equal in magnitude and opposite in polarity regardless of the load configuration.

A widely used circuit described in 1980 (T. Hay, "Differential Technology in Recording Consoles and the Impact of Transformerless Circuitry on Grounding Technique." Presented at the 67th Convention of the Audio Engineering Society, Journal of Audio Engineering Society (Abstracts), vol. 28, p.924 (December 1980)) is shown in FIG. 1. It accepts a single-ended input voltage $v_{in}$ with respect to ground at terminal IN. It produces a differential output voltage (equal to twice the input voltage) between nodes OUT+ and OUT−. This circuit accomplishes the desired goals with respect to differential and common-mode output impedances. Under normal operation, the differential output impedance is substantially determined by the sum of output resistances $R_{O1}$ and $R_{O2}$, as negative feedback around the operational amplifiers OA1 and OA2 substantially reduces their internal closed-loop output impedances. $R_{O1}$ and $R_{O2}$ are typically between 10 and 100 ohms in order to keep the differential output impedance relatively low. The common-mode output impedance is quite high, and can be infinite if the ratios of the resistances labeled R and 2R in the schematic are precisely maintained. It should be noted that mismatches in these resistor ratios can either reduce the common-mode output impedance if the mismatches are in one direction, or can lead to instability if they are in the other direction. This requirement for precise resistor-ratio matching is a drawback to this circuit.

It should be clear that the common-mode behavior of the circuit of FIG. 1 is governed by both opamps, OA1 and OA2. When driving a single-ended load, as in FIG. 2, the combined common-mode feedback forces the output currents to be equal and opposite (assuming exact resistor ratios around the opamps). This behavior is one of the most desirable properties of such circuits. However, if an input signal is applied to terminal IN that causes the output signal at the ungrounded output (in this case, OUT+), to exceed the maximum permitted by the power supply voltage, both the differential and common-mode feedback loops are broken. As is expected, the differential output voltage waveform at the OUT+ output would be "clipped" at the opamp's maximum output voltage. Its output current will be the output voltage divided by the load resistance. What is not as obvious is that, while clipping is occurring, the output current of the grounded OUT− output will be quite high, typically limited only by any protective current limiting circuit in the opamp, or by the maximum opamp output voltage divided by the value of the 10-to-100 ohm output resistor. This current must flow through an indeterminate path through the ground structure of the load device to return to the output stage, which can lead to disturbances on the audio waveform that are more audible than simple clipping.

An alternative approach to a floating balanced output circuit was described in 1990 by Chris Strahm in U.S. Pat. No. 4,979,218. Strahm's circuit includes separate feedback loops for differential and common-mode output signals. The differential loop is configured to force the differential output voltage to substantially equal the input voltage multiplied by some desired gain, and the common-mode feedback loop is configured to force the two output terminal currents to be equal and opposite. This at least opens up the possibility of preventing the clipping behavior and the audio waveform disturbances described above. Also, as described in the Strahm patent, precise resistor ratios are not necessary to maintain stability of the circuit.

Although not mentioned in the Strahm patent, in order to prevent a grounded output of such a circuit from going into current limiting when the active output is driven into voltage clipping, the common-mode feedback loop must remain active even though the differential feedback loop is disabled. In fact, the integrated circuit device manufactured by the assignee (Audio Teknology Inc.) based on the Strahm patent is implemented in a way that does not preserve the functionality of the common-mode feedback loop when the differential feedback loop is broken due to voltage clipping into a grounded load. As shown in FIG. 3, a differential pair of transistors, $Q_1$ and $Q_2$, accept the input signal and the differential feedback signal. Transistor $Q_3$ provides the tail current $I_{tail}$ for the differential pair. $Q_3$ is controlled by the common-mode feedback signal. In this case, the common-mode feedback signal is derived by sensing the sum of the output currents from the device, as described in the Strahm patent. Thus, the common-mode output voltage is adjusted via feedback through $I_{tail}$ until the two device output currents sum to nearly zero, and, are thus nearly equal and opposite. When voltage clipping occurs at either amplifier output, one of $Q_1$ or $Q_2$ will saturate while the other will be cut off. If the circuit is driving a ground-referred load from the output amplifier that is driven by the cutoff transistor, then there is no way for $Q_3$ to affect the output voltage and common-mode feedback is also disabled. Without common-mode feedback to maintain control over the output currents, the grounded output amplifier conducts as much current as permitted by other aspects of the amplifier design, such as protective current limiting.

DETAILED DESCRIPTION OF THE DRAWINGS

Figure 1:
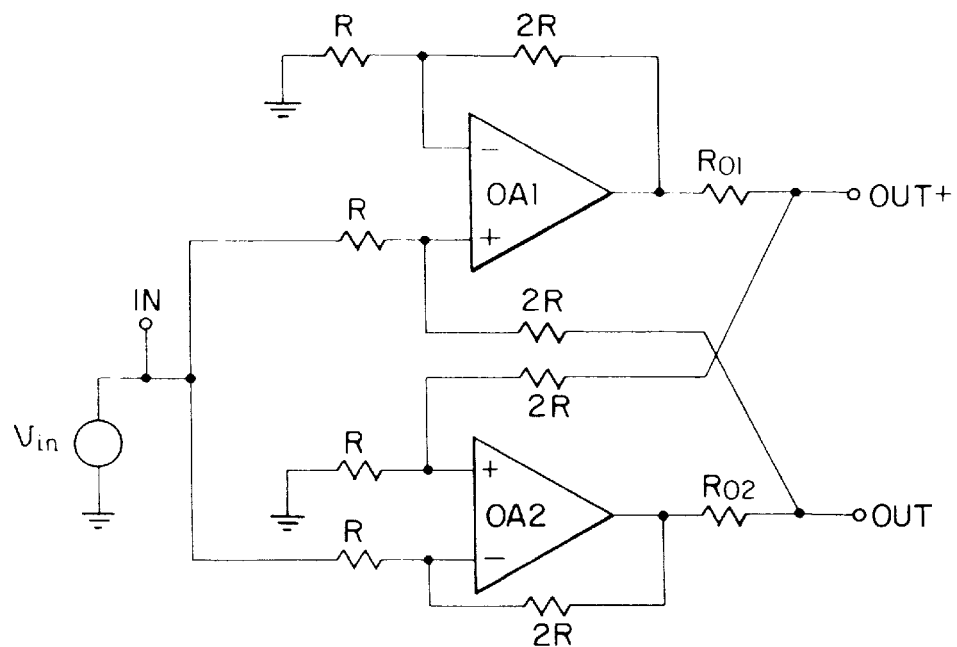
FIG. 1 is a schematic drawing of a prior art circuit that uses positive and negative feedback to emulate a floating voltage source.
Figure 2:
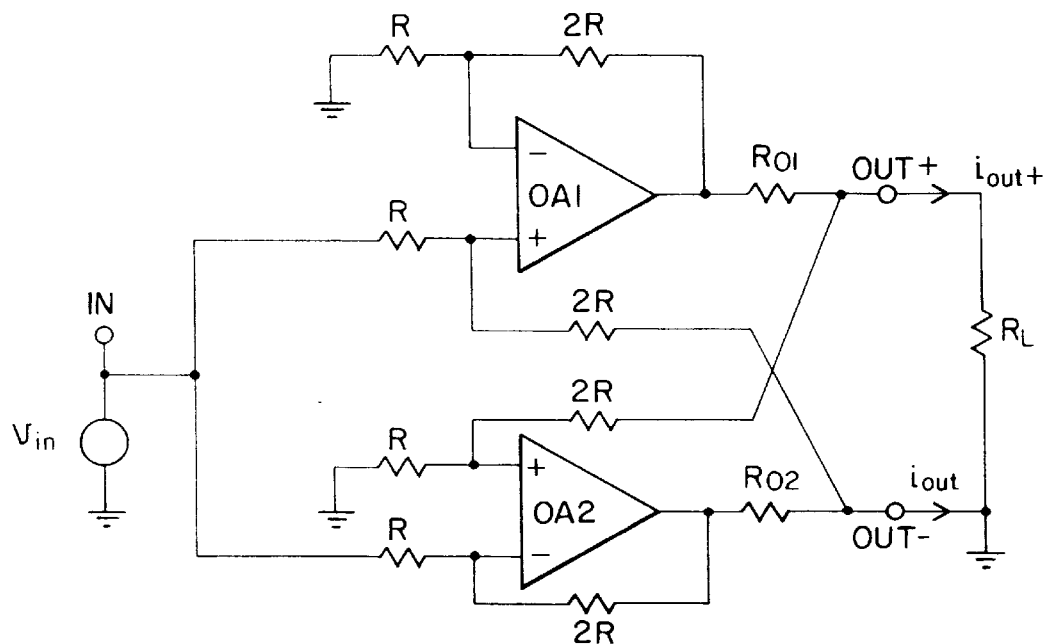
FIG. 2 shows a schematic drawing of the prior art circuit of FIG. 1 connected to drive a single ended load.
Figure 3:
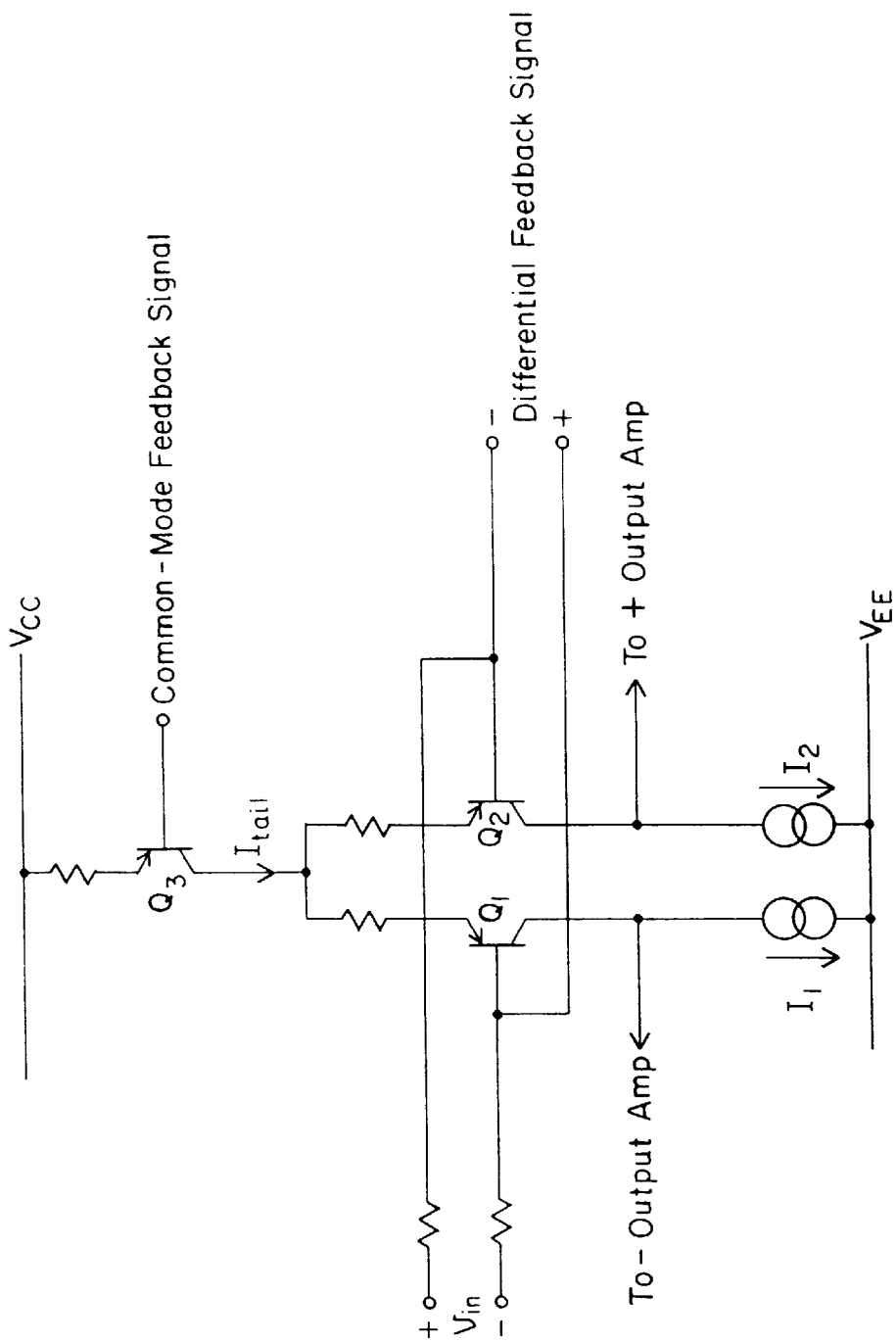
FIG. 3 shows a schematic drawing of a prior art circuit for implementing a common mode feedback loop.
Figure 4:
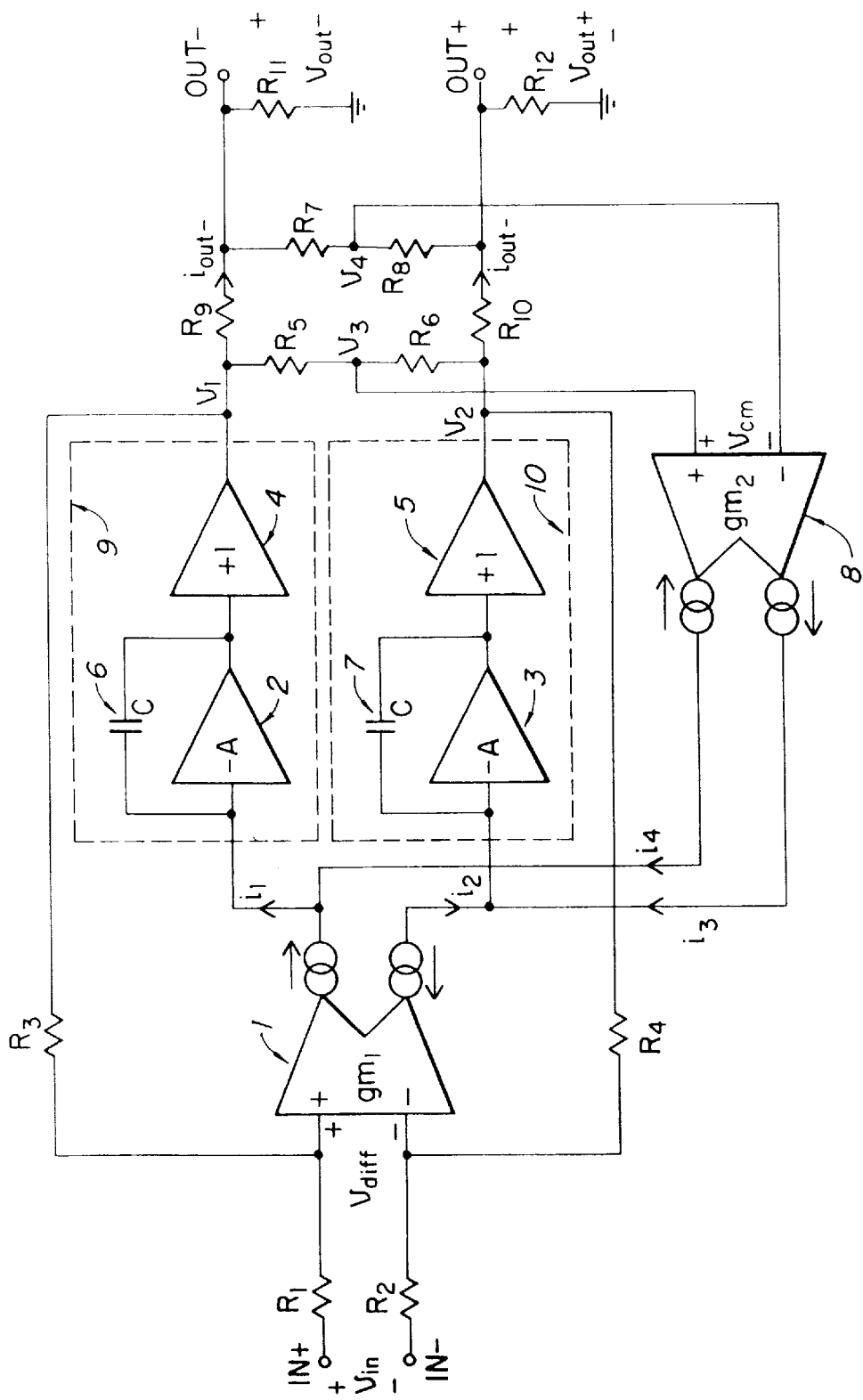
FIG. 4 shows a schematic drawing of an improved circuit that uses separate differential and common-mode feedback loops to emulate a floating voltage source and controls the output common-mode current under clipping conditions while driving a ground-referred load.

FIG. 4 shows a schematic drawing of one embodiment of an improved circuit that uses separate differential and common-mode feedback loops to emulate a floating voltage source and controls the output common-mode current under clipping conditions while driving a ground-referred load. As shown, transconductance amplifier 1 is a circuit that accepts a differential input voltage and delivers as its outputs a pair of differential output currents such that:

$$i_1 = -i_2 = g_{m1} \cdot v_{diff} \qquad (1)$$

This transconductance amplifier, along with identical inverting high-gain voltage amplifiers 2 and 3, identical buffer amplifiers 4 and 5, and identical compensation capacitors 6 and 7 form a two-stage fully-differential operational amplifier. Resistors $R_1$ and $R_2$ are connected from the input voltage terminals IN+ and IN−, respectively, to the non-inverting and inverting terminals of transconductance amplifier 1, respectively. Resistors $R_3$ and $R_4$ are connected from the outputs of buffer amplifiers 4 and 5, respectively, to the non-inverting and inverting inputs of transconductance amplifier 1, respectively, to provide differential negative feedback. As long as the forward gain provided by transconductance amplifier 1 and voltage amplifiers 2 and 3 is large compared to the desired closed loop gain, then the differential closed loop gain $A_{cld}$ will be substantially:

$$A_{cld} = \frac{v_{out+} - v_{out-}}{v_{in}} = \frac{R_3 + R_4}{R_1 + R_2} \qquad (2)$$

Preferably, $R_1 = R_2$ and $R_3 = R_4$, so that the differential closed loop gain will be:

$$A_{cld} = \frac{R_4}{R_1} \qquad (3)$$

In a preferred embodiment, $R_1 = R_2 = 5$ k$\Omega$ and $R_3 = R_4 = 10$ k$\Omega$. It should be noted that either terminal IN+ or IN− can be grounded, and the input signal connected in a single-ended fashion, with no loss of functionality.

Transconductance amplifier 8 is a circuit that accepts a differential input voltage and delivers as its outputs a pair of matched output currents $i_3$ and $i_4$ such that:

$$i_3 = i_4 = g_{m2} \cdot v_{cm} \qquad (1)$$

These output currents $i_3$ and $i_4$ respectively sum with the output currents $i_2$ and $i_1$ of transconductance amplifier 1. Note that the output currents $i_3$ and $i_4$ from transconductance amplifier 8 will cause both output voltages ($V_{out+}$ and $V_{out-}$) to move in the same direction, while the output currents $i_1$ and $i_2$ from transconductance amplifier 1 will cause the two output voltages ($v_{out+}$ and $v_{out-}$) to move in opposite directions. Resistors $R_9$ and $R_{10}$ are used to sense the individual output currents, and preferably are of equal value between about 10 and about 100 ohms in order to maintain low differential output impedance, although the values can be outside this range. Resistors $R_{11}$ and $R_{12}$ serve to establish a minimum common-mode load for the circuit, and are preferably between about 1 k$\Omega$ and about 100 k$\Omega$, although the values can be outside this range. Resistors $R_5$ through $R_8$ form a bridge used to sense the common-mode output current. Preferably, $R_5 = R_6$ and $R_7 = R_8$. In this case the voltage $v_3$ at the junction of $R_5$ and $R_6$ will be:

$$v_3 = \frac{v_1 + v_2}{2}, \qquad (5)$$

and the voltage $v_4$ at the junction of $R_7$ and $R_8$ will be:

$$v_4 = \frac{v_{out+} + v_{out-}}{2}. \qquad (6)$$

Noting that the currents through $R_9$ and $R_{10}$ are:

$$i_{out+} = \frac{v_2 - v_{out+}}{R_{10}} \text{ and,} \qquad (7)$$

$$i_{out-} = \frac{v_1 - v_{out-}}{R_9} \qquad (8)$$

the input voltage to transconductance amplifier 8 will be:

$$v_{cm} = \frac{i_{out-} \cdot R_9 + i_{out+} \cdot R_{10}}{2} \qquad (9)$$

Assuming that $R_9$ and $R_{10}$ are equal, this voltage is:

$$v_{cm} = \frac{(i_{out+} + i_{out-}) \cdot R_9}{2}, \qquad (10)$$

which is proportional to the common-mode output current, $$\frac{(i_{out+} + i_{out-})}{2}. \qquad (11)$$

The large gain provided by the combination of transconductance amplifier 8 and voltage amplifiers 2 and 3 will tend to minimize the differential voltage at the transconductance amplifier's inputs via negative feedback. This will then tend to minimize the common-mode output current, leaving only differential (equal and opposite) currents.

Both transconductance amplifiers must be designed to have a maximum possible output current that is achieved when the input voltage exceeds a predefined level. (This is a natural consequence of the preferred implementations, as will be illustrated below). In order to ensure that the common mode feedback loop will remain active when the differential loop has been disabled due to clipping, the maximum output currents from transconductance amplifier 8 must be made greater than the maximum output currents from transconductance amplifier 1. As an example, assume that $R_{11}$ is a short circuit, such that $R_{12}$ serves as a ground-referred load, and that the input voltage $v_{in}$ is sufficiently positive to drive $v_2$ to the maximum possible positive voltage allowed by the circuit power supplies. The negative feedback path via $R_4$ is now broken, as the voltage $v_2$ no longer responds to any change in the input voltage. Under such conditions, $i_1$ and $i_2$ will be at their maximum possible values (in opposite directions). Current $i_1$ will tend to drive voltage $v_1$ negative, and, if left unchecked, will cause a large current to flow through low-valued resistor $R_9$. However, if transconductance amplifier 8 has sufficient output current capability to sink the maximum value of $i_1$, then the common-mode feedback loop will act to minimize the common-mode output current. Under these conditions, $i_4$ will be substantially equal to $-i_1$, and $i_{out-}$ will be substantially equal to $-_{out+}$.

It should be clear that output stages 9 and 10, consisting of voltage amplifiers 2 and 3, buffer stages 4 and 5, and compensation capacitors 6 and 7 may take many preferred forms without departing from the scope of the invention. As an example, when utilizing bipolar transistors, voltage amplifiers 2 and 3 may consist of current-source-loaded common emitter amplifiers, and buffer amplifiers 4 and 5 may consist of complementary common-collector amplifiers. Other devices, such as MOS transistors, could also be substituted with no loss of essential functionality. Also, differential feedback resistors $R_3$ and $R_4$ could alternately be connected directly to the OUT+ and OUT− terminals, rather than to the outputs of buffer amplifiers 4 and 5. Such an arrangement would result in lower differential output impedance, but would require more elaborate frequency compensation in order to maintain stability into capacitive loads.

Figure 5:
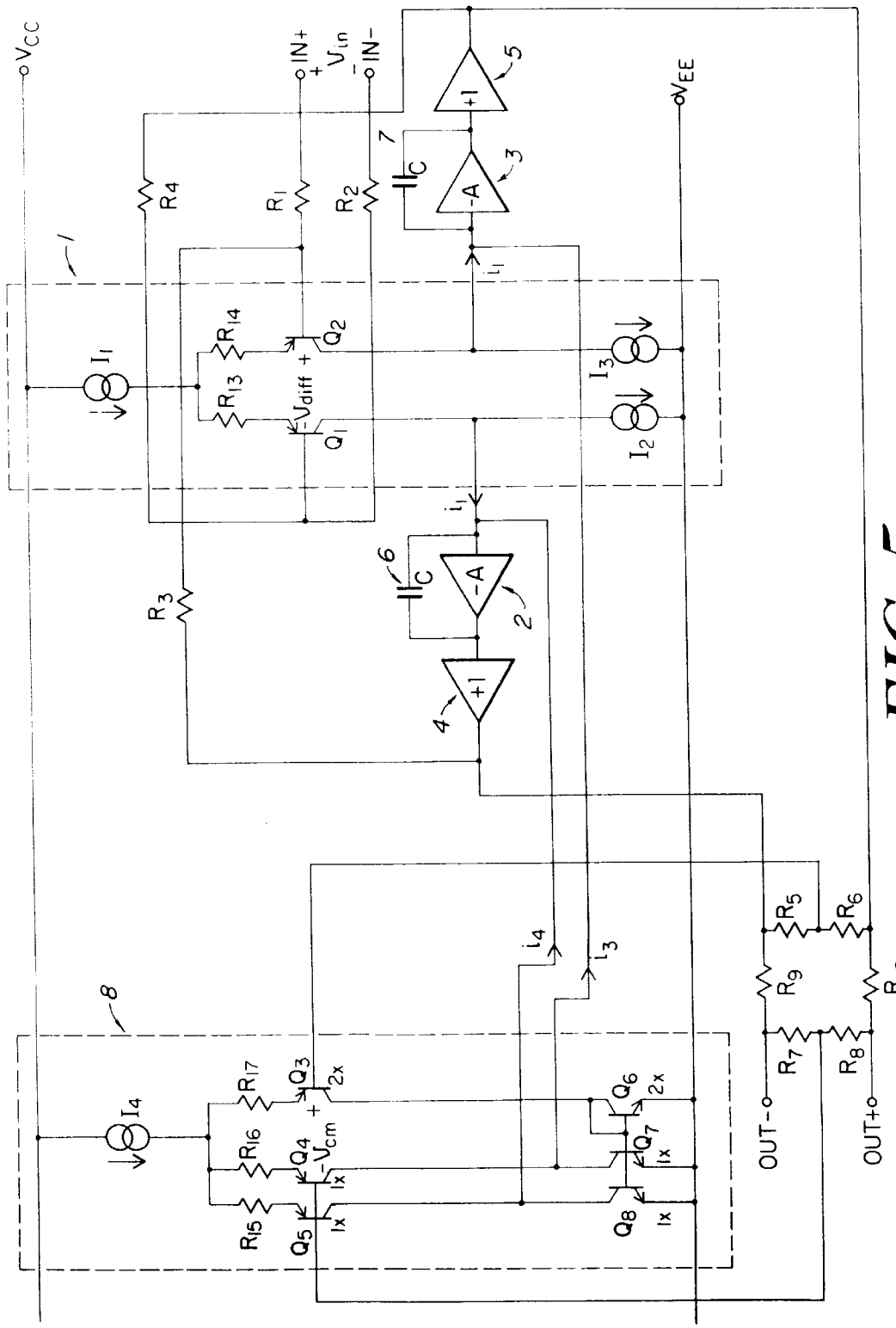
FIG. 5 shows a schematic drawing of the preferred transconductance amplifiers used in the FIG. 4 circuit.

A preferred embodiment of transconductance amplifier 1 is shown in FIG. 5. This structure comprises differential pair transistors $Q_1$ and $Q_2$, current sources $I_1$, $I_2$, and $I_3$ and optional equal-valued emitter degeneration resistors $R_{13}$ and $R_{14}$. The differential input to the transconductance amplifier is applied to the bases of $Q_1$ and $Q_2$. The differential output currents are taken from the collectors of $Q_1$ and $Q_2$. Preferably, the values of current sources $I_2$ and $I_3$ are each equal to one half of the value of current source $I_1$. In this case, the maximum current available in either direction from the collectors of $Q_1$ and $Q_2$ is equal to $I_1/2$. The transconductance from the voltage between the bases of $Q_1$ and $Q_2$ to either of the collectors of $Q_1$ or $Q_2$ is:

$$g_{m1} = \frac{1}{\frac{2kT}{qI_1} + R_{13} + R_{14}} = \frac{1}{\frac{2kT}{qI_1} + 2R_{13}}. \quad (12)$$

A preferred embodiment of transconductance amplifier 8 is also shown in FIG. 5. It comprises transistors $Q_3$ through $Q_8$, current source $I_4$, and optional emitter degeneration resistors $R_{15}$ through $R_{17}$. Preferably, transistor $Q_3$ has an emitter area twice that of $Q_4$ and $Q_5$. Also, if included, the value emitter degeneration resistor $R_{17}$ is half the value of identically-valued resistors $R_{15}$ and $R_{16}$. Thus, with no differential voltage applied between the base of transistor $Q_3$ and the common bases of transistors of $Q_4$ and $Q_5$, $Q_3$ will operate at a collector current equal to $I_4/2$, and transistors $Q_4$ and $Q_5$ will each operate at a collector current equal to $I_4/4$. Similarly, transistor $Q_6$ has an emitter area twice that of transistors $Q_7$ and $Q_8$. Thus, ignoring base currents, the collector current of $Q_6$ will be mirrored to the collectors of $Q_7$ and $Q_8$ with a gain of 0.5, such that each will operate at a collector current equal to one half of $Q_6$'s collector current. The differential input voltage to transconductance amplifier 8 is applied between the base of transistor $Q_3$ and the common bases of transistors $Q_4$ and $Q_5$. Identical output currents are taken from the collectors of $Q_7$ and $Q_8$. The transconductance from the input differential voltage to either of the identical current outputs will be:

$$g_{m2} = \frac{1}{\frac{2kT}{qI_4} + \frac{R_{15} + R_{16}}{2} + R_{17}} = \frac{1}{\frac{2kT}{qI_4} + 2R_{17}}. \quad (13)$$

The maximum output current available in either direction from the collectors of $Q_4$ and $Q_5$ is equal to one half the value of current source $I_4$. Thus, as described above, current source $I_4$ should be made greater in value than current source $I_1$ in order to ensure that the common-mode feedback loop will remain active after the differential feedback loop is disabled by clipping.

Figure 6:
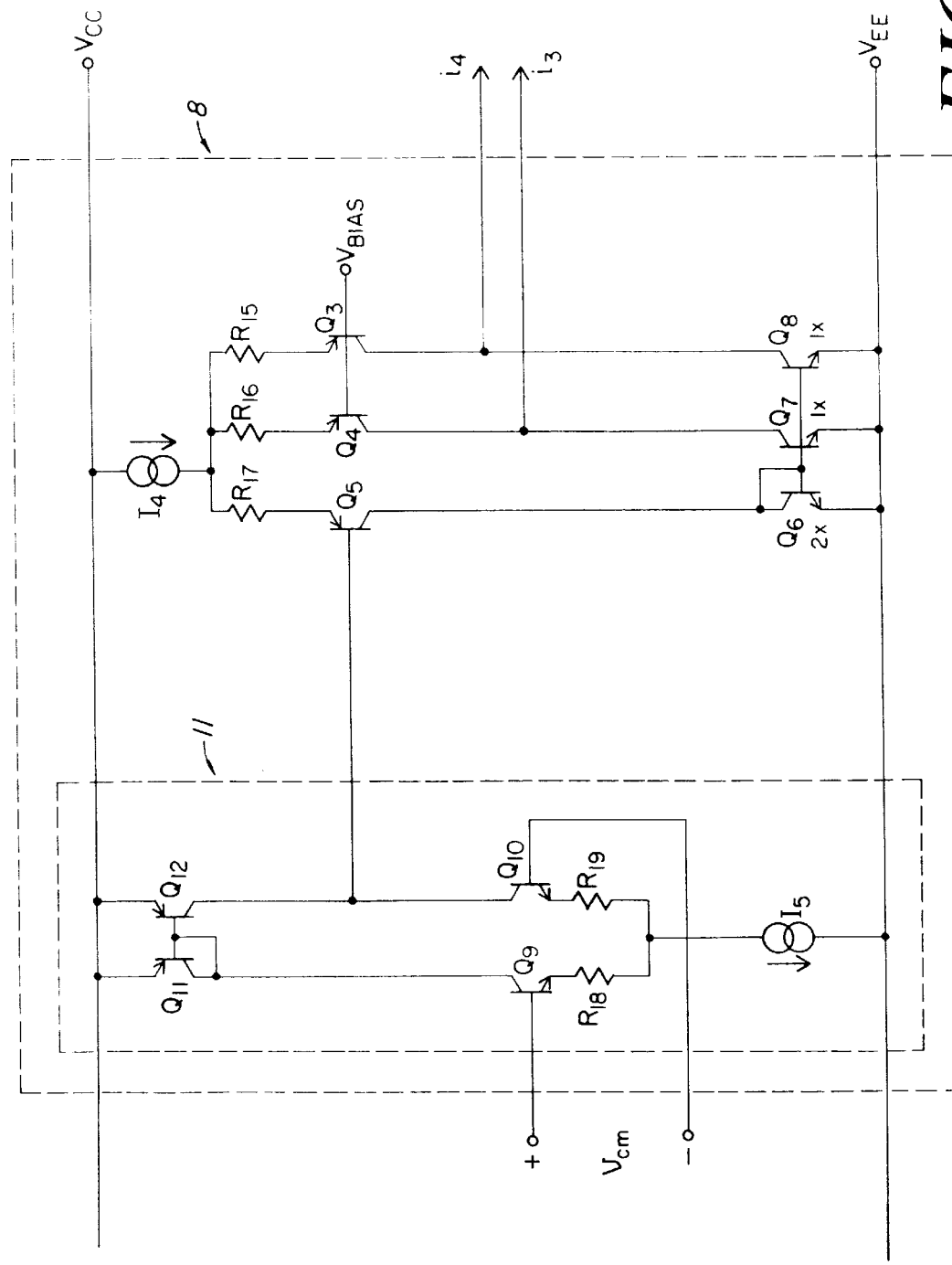
FIG. 6 shows a schematic drawing of the differential-input, dual-output transconductance amplifier shown in FIG. 5 modified to include an additional gain stage.

In an embodiment of the invention such as that shown in FIG. 5, when the differential feedback loop has been broken due to output voltage clipping, either transistors $Q_7$ and $Q_8$ are sinking collector currents equal to at least $I_1/2$, or transistors $Q_4$ and $Q_5$ are sourcing collector currents equal to at least $I_1/2$. Under these conditions, a current imbalance equal to the value of current source $I_1$ will exist between the collector current of $Q_3$ and the sum of the collector currents of $Q_4$ and $Q_5$. This current imbalance will cause an input offset voltage (in addition to that caused by random transistor and resistor mismatches) at the inputs of transconductance amplifier 8 equal to $I_1/g_{m2}$. This additional input offset voltage will degrade the matching of the magnitudes of the currents in resistors $R_9$ and $R_{10}$ under the aforementioned conditions. If this degradation of performance is unacceptable, an additional gain stage can be added to transconductance amplifier 8 as illustrated in FIG. 6. Differential pair transistors $Q_9$ and $Q_{10}$, optional identical emitter degeneration transistors $R_{18}$ and $R_{19}$, current mirror transistors $Q_{11}$ and $Q_{12}$, and current source $I_5$ make up a differential amplifier with a single-ended current output. The input voltage to transconductance amplifier 8 is applied between the bases of $Q_9$ and $Q_{10}$. The output current from the collectors of $Q_{12}$ and $Q_{10}$ is applied to the base of $Q_5$ of the previously described differential-input, dual-output transconductance amplifier. The common bases of $Q_3$ and $Q_4$ are tied to an appropriate bias voltage source, preferably far enough below Vcc to ensure proper operation of current source $I_4$ and transistors $Q_3$ through $Q_5$. The dual output currents are taken from the collectors of $Q_7$ and $Q_8$ as described above. With this modification to dual-output transconductance amplifier 8, the additional offset voltage created between the base of $Q_5$ and the common bases of $Q_3$ and $Q_4$ when the differential feedback loop is disabled due to clipping is reduced by the gain of differential amplifier stage 11. This results in very little change in input offset voltage at the bases of $Q_9$ and $Q_{10}$.

It should be understood that the functions of the circuits above can be implemented in different ways without departing from the scope of the invention. For instance, the current mirrors composed of $Q_6$ through $Q_8$ and $Q_{11}$ through $Q_{12}$ could be any of a number of improved current mirrors known in the art such as the Wilson current mirror, the cascoded current mirror, or the emitter-follower-augmented current mirror. Additionally, each mirror could have emitter degeneration resistors added to increase the output impedance. Further, the differential inputs of transconductance amplifiers 1 and 8 could have emitter follower buffers, and/or bias current cancellation circuitry added to minimize input bias current. As mentioned above, all of the circuits could be implemented with a different transistor technology, such as MOS transistors.

Figure 7:
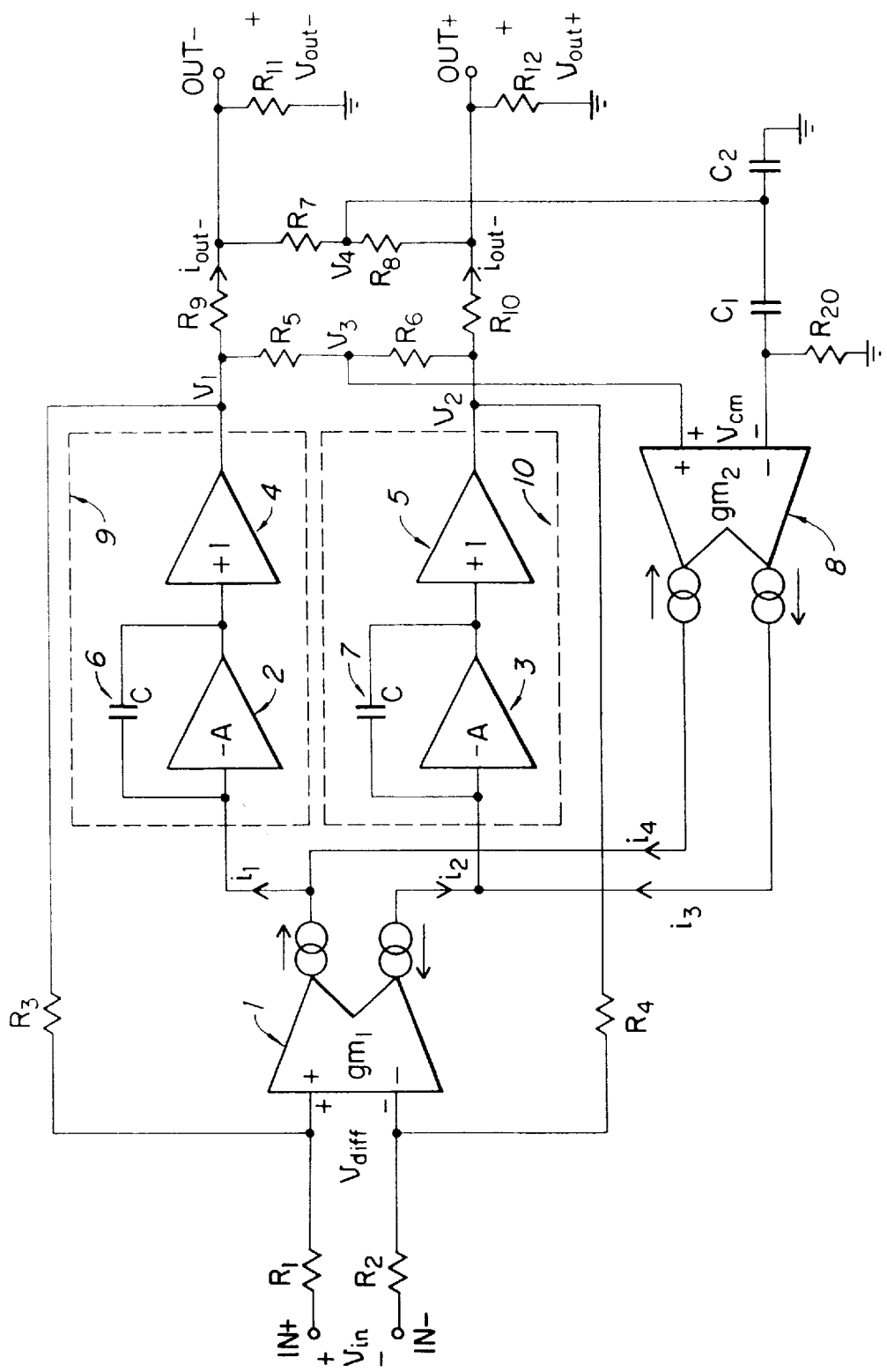
FIG. 7 shows a schematic drawing illustrates a further modification to minimize output common-mode voltage.

Referring to FIG. 4, there will always exist some finite input offset voltage at the differential inputs of transconductance amplifier 8 due to transistor and resistor mismatches. Such offset voltages will give rise to a common-mode offset current flowing in resistors $R_9$ and $R_{10}$ equal to the input offset voltage divided by the resistance value of $R_9$ and $R_{10}$. These currents will then be converted to a common-mode offset voltage across resistors $R_{11}$ and $R_{12}$ (and any external load resistance). As $R_9$ and $R_{10}$ are preferably low-valued, as mentioned above, and $R_{11}$ and $R_{12}$ are preferably higher valued, a small input offset voltage at the input to transconductance amplifier 8 can result in a substantially larger common-mode output offset voltage at the OUT+ and OUT− terminals. FIG. 7 illustrates one preferred method to minimize this effect.

In FIG. 7, capacitor $C_1$ is inserted between the junction of resistors $R_7$ and $R_8$ and the inverting input of transconductance amplifier 8. Resistor $R_{20}$ is added from the inverting input of transconductance amplifier 8 to ground. $R_{20}$ is preferably chosen to be large enough in value so as not to significantly load $R_7$ and $R_8$, preferably, although not necessarily 1 MΩ or larger if $R_5$ through $R_8$ are all about or within a small range of 10 kΩ. $C_1$ is chosen so that the high-pass filter formed by $C_1$ and $R_{20}$ has a pole frequency substantially lower than the operational frequencies of interest. For example, a value of 100 nF for $C_1$ and 1 MΩ for $R_{20}$ will result in a pole frequency $f_{php}$ of:

$$f_{php} = \frac{1}{2\pi(100 \text{ nF})(1M\Omega)} = 1.6 \text{ Hz}, \quad (14)$$

which is well below the band of interest for audio applications. Thus, in the audio band, the common-mode feedback loop will minimize the output common-mode current, forcing equal and opposite currents in $R_9$ and $R_{10}$. At DC, the common-mode feedback loop will tend to force the junction of $R_5$ and $R_6$ (and thus the output common-mode voltage) to the ground potential, plus or minus any input offset voltage at transconductance amplifier 8's inputs.

One of the primary applications for floating, balanced output circuits in the professional audio industry is to drive audio signals over cables of up to 1000 feet long. Such cables represent a reactive load on the circuit, with resonant frequencies that may coincide with the unity-gain frequency of the common-mode feedback loop. Such resonances can cause peaks in the loop transmission that will compromise the stability of the loop. The common-mode feedback loop can be isolated from these loading effects with the addition of $C_2$, also shown in FIG. 7. $C_2$ is preferably chosen so that the lowpass filter that it forms with the parallel combination of $R_7$ and $R_8$ is substantially higher than the operation frequencies of interest, but below the unity-gain crossover frequency of the common-mode feedback loop. In a preferred embodiment, with $R_3$ through $R_8$ all equal to about 10 kΩ, $C_2$ is equal to about 10 pF. This results in a pole frequency of:

$$f_{plp} = \frac{1}{2\pi(10 \text{ pF})(5k\Omega)} = 3.2 \text{ MHz}, \quad (15)$$

which is well above the audio band. Thus, the common-mode feedback loop will continue to minimize the common-mode output current, while at frequencies substantially above 3 MHz, $C_2$ will shunt the inverting input of transconductance amplifier 8 to ground, isolating it from the response peaks due to resonant loads.

Figure 8:
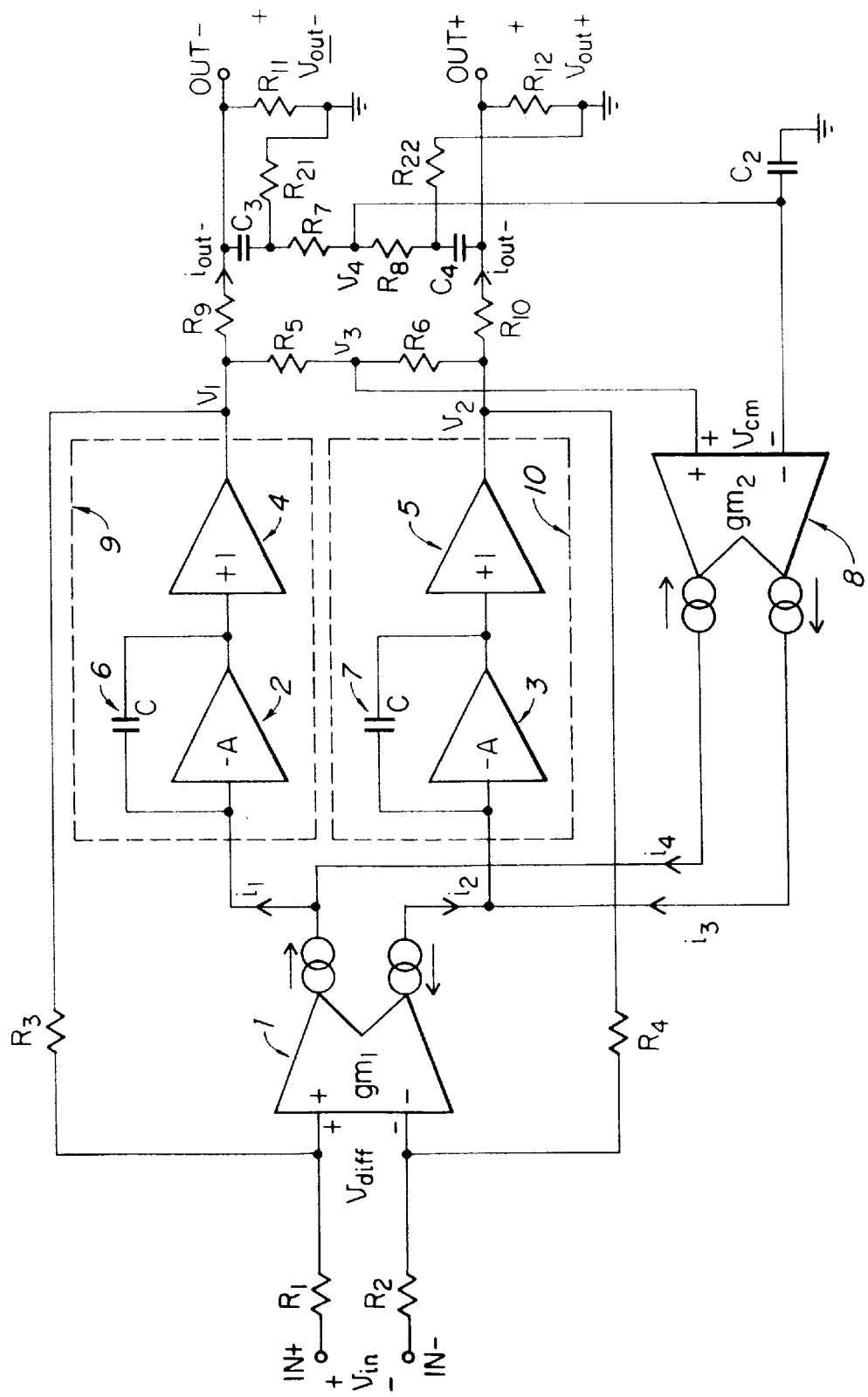
FIG. 8 shows a schematic drawing illustrates another modification to minimize output common-mode voltage.

FIG. 8 illustrates an alternative and preferred method of minimizing the output common-mode voltage. Capacitor $C_3$ is inserted between the OUT− terminal and resistor $R_7$. Likewise, capacitor $C_4$ is inserted between the OUT+ terminal and resistor $R_8$. Resistor $R_2$, is added from the junction of $C_3$ and $R_7$ to ground, and resistor $R_{22}$ is added from the junction of $C_4$ and $R_8$ to ground. In a one implementation of this preferred embodiment $C_3$ and $C_4$ are each about 10 μF, and $R_{21}$, and $R_{22}$ are each about 20 kΩ. Like the circuit shown in FIG. 7, this circuit will minimize the common-mode output current in the audio band, but force the output common-mode voltage to the ground potential at DC. The circuit in FIG. 8 will maintain a superior match between the output current magnitudes when driving a ground referred load compared with the circuit in FIG. 7. This is due to the absence of any loading on $R_7$ and $R_8$. However, this comes at the expense of an additional capacitor and an additional resistor.

The embodiment and practices described in this specification have been presented by way of illustration rather than limitation, and various modifications, combinations and substitutions may be effected by those skilled in the art without departure either in spirit or scope from this disclosure in its broader aspects and as set forth in the appended claims.

I claim:

1. A floating, balanced output circuit for providing a differential output voltage in response to an input voltage, with a relatively low differential output impedance and a relatively high common-mode output impedance, comprising:

a first transconductance amplifier section for providing a differential pair of output currents in response to the input voltage, the currents being substantially equal in magnitude and opposite in polarity;

an intermediate section connected so as to generate an intermediate differential voltage in response to the pair of output currents of the first transconductance amplifier;

an output section for generating the differential output voltage in response to the intermediate differential voltage;

a differential feedback loop configuration connected around the first transconductance amplifier section and the intermediate section so as to provide differential negative feedback; and common-mode feedback loop configuration comprising a second transconductance amplifier section connected around the intermediate section so as to respectively add a pair of substantially matched output currents to the output currents of the first transconductance amplifier stage in response to the common mode current;

wherein the first and second transconductance amplifiers are designed so that the common mode feedback loop configuration remains active when the differential loop configuration has been disabled due to clipping when the input voltage exceeds a predefined level.

2. A circuit according to claim 1, further including a fully-differential operational amplifier comprising the first transconductance amplifier and the intermediate section.

3. A circuit according to claim 1, wherein the magnitudes of the maximum output currents from the second transconductance amplifier are greater than the magnitudes of the maximum output currents from the first transconductance amplifier.

4. A circuit according to claim 1, further including an input coupled to the first transconductance amplifier configured to receive a differential input voltage.

5. A circuit according to claim 1, further including an input coupled to the first transconductance amplifier configured to receive a single-ended input voltage.

6. A circuit according to claim 1, wherein the common-mode feedback loop configuration includes a current sensing section that is configured to sense the common-mode output current and applying a voltage proportional to said common-mode output current to the inputs of said second transconductace amplifier.

7. A circuit according to claim 6, wherein current sensing section includes a pair of identical output resistors in series with said two outputs of the intermediate section, and a four-resistor bridge configured to produce an output voltage proportional to the sum of the currents in said identical output resistors.

8. A circuit according to claim 7, wherein further including a decoupler for decoupling the resistor bridge from reactive loads connected to the output of the circuit at high frequencies.

9. A circuit according to claim 8, wherein the decoupler includes a capacitor connecting one output of the bridge to ground.

10. A circuit according to claim 9, wherein said voltage proportional to said common-mode output currents is ac-coupled to said resistor bridge with a pair of capacitors and a pair of resistors to ground.

11. A circuit according to claim 1, wherein said first transconductance amplifier comprises a differential pair of transistors with an emitter current source and a current-source load for each collector of said differential pair of transistors.

12. A circuit according to claim 1, wherein the common-mode feedback loop configuration includes a current sensing section that is configured to sense the common-mode output current and applying a voltage proportional to said common-mode output current to the inputs of said second transconductace amplifier, and the second transconductance amplifier comprises a differential transistor configuration having first and second transistors whose bases are connected so that the applied voltage from the current sensing section, and a third transistor connected with its base tied to the base of the second transistor, and the collectors of the second and third transistors respectively being coupled to the output of the second transconductance amplifier.

13. A circuit according to claim 12, wherein the emitter area of the first transistor is twice the emitter area of each of the second and third transistors.

14. A circuit according to claim 1, wherein said voltage proportional to said common-mode output currents is ac-coupled to said differential-input, dual-output transconductance amplifier so as to minimize the affect of any offset voltage applied to the input of the second transconductance amplifier.

15. A circuit according to claim 14, wherein said voltage proportional to said common-mode output currents is ac-coupled to the input of the second transconductance amplifier.

16. A floating, balanced output circuit for providing a differential output voltage in response to an input voltage, with a relatively low differential output impedance and a relatively high common-mode output impedance, comprising:

a main current path including a first transconductance amplifier section for providing a differential pair of output currents in response to the input voltage, the currents being substantially equal in magnitude and opposite in polarity, and a subsequent section connected so as to generate an output signal in response to the pair of output currents of the first transconductance amplifier;

a differential feedback loop configuration connected around the first transconductance amplifier section so as to provide differential negative feedback; and a common-mode feedback loop configuration comprising a second transconductance amplifier section connected around the subsequent section so as to respectively add a pair of substantially matched output currents to the output currents of the first transconductance amplifier stage in response to the output signal;

wherein the first and second transconductance amplifiers are designed so that the common mode feedback loop configuration remains active when the differential loop configuration has been disabled due to clipping when the input voltage exceeds a predefined level.

17. A circuit according to claim 16, wherein the first transconductance amplifier section provides the differential pair of output currents in response to the input voltage, the currents being substantially equal in magnitude and opposite in polarity; and the subsequent section is connected so as to generate an intermediate differential voltage in response to the pair of output currents of the first transconductance amplifier; the circuit further including:

an output section for generating a differential output voltage in response to the intermediate differential voltage.

18. A circuit according to claim 17, wherein the differential feedback loop configuration is connected around the first transconductance amplifier section and the intermediate section so as to provide differential negative feedback in response to the intermediate differential voltage; and the second transconductance amplifier section is connected around the intermediate section so as to respectively add a pair of substantially matched output currents to the output currents of the first transconductance amplifier stage in response to the common mode current.

19. A method of configuring a floating, balanced output circuit so as to provide a differential output voltage in response to an input voltage, with a relatively low differential output impedance and a relatively high common-mode output impedance, comprising:

configuring and connecting the following components:

a main current path including a first transconductance amplifier section for providing a differential pair of output currents in response to the input voltage, the currents being substantially equal in magnitude and opposite in polarity, and a subsequent section connected so as to generate an output signal in response to the pair of output currents of the first transconductance amplifier;

a differential feedback loop configuration connected around the first transconductance amplifier section so as to provide differential negative feedback; and a common-mode feedback loop configuration comprising a second transconductance amplifier section connected around the subsequent section so as to respectively add a pair of substantially matched output currents to the output currents of the first transconductance amplifier stage in response to the output signal;

wherein the first and second transconductance amplifiers are designed so that the common mode feedback loop configuration remains active when the differential loop configuration has been disabled due to clipping when the input voltage exceeds a predefined level.

20. A method according to claim 19, wherein the first transconductance amplifier section provides the differential pair of output currents in response to the input voltage, the currents being substantially equal in magnitude and opposite in polarity; and the subsequent section is connected so as to generate an intermediate differential voltage in response to the pair of output currents of the first transconductance amplifier; the circuit further being connected and configured so as to comprise an output section for generating a differential output voltage in response to the intermediate differential voltage.

21. A method according to claim 20, wherein the differential feedback loop configuration is connected around the first transconductance amplifier section and the intermediate section so as to provide differential negative feedback in response to the intermediate differential voltage; and the second transconductance amplifier section is connected around the intermediate section so as to respectively add a pair of substantially matched output currents to the output currents of the first transconductance amplifier stage in response to the common mode current.

* * * * *

UNITED STATES PATENT AND TRADEMARK OFFICE
CERTIFICATE OF CORRECTION

PATENT NO. : 6,316,970 B1
DATED : November 13, 2001
INVENTOR(S) : Gary K. Hebert It is certified that error appears in the above-identified patent and that said Letters Patent is hereby corrected as shown below:

<u>Drawings,</u>
Figure 4, add -- - -- adjacent $R_{11}$, below $V_{out-}$.

<u>Column 1,</u>
Line 54, delete "closed-loop" and insert therefor -- open-loop --; and <u>Column 5,</u>
Line 18, delete "-$_{out+}$" and insert therefor -- $i_{out+}$ --.

Signed and Sealed this

Sixth Day of August, 2002

Attest:

JAMES E. ROGAN
*Attesting Officer*  *Director of the United States Patent and Trademark Office*